United States Patent
Hao et al.

(10) Patent No.: US 9,537,001 B2
(45) Date of Patent: Jan. 3, 2017

(54) REDUCTION OF DEGRADATION DUE TO HOT CARRIER INJECTION

(71) Applicant: FAIRCHILD SEMICONDUCTOR CORPORATION, San Jose, CA (US)

(72) Inventors: Jifa Hao, Scarborough, MA (US); Daniel Hahn, Portland, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/752,373

(22) Filed: Jun. 26, 2015

(65) Prior Publication Data

US 2016/0035883 A1 Feb. 4, 2016

Related U.S. Application Data

(60) Provisional application No. 62/031,044, filed on Jul. 30, 2014.

(51) Int. Cl.
| H01L 29/66 | (2006.01) |
| H01L 29/78 | (2006.01) |
| H01L 29/423 | (2006.01) |
| H01L 29/06 | (2006.01) |
| H01L 29/40 | (2006.01) |

(52) U.S. Cl.
CPC ......... *H01L 29/7816* (2013.01); *H01L 29/063* (2013.01); *H01L 29/0634* (2013.01); *H01L 29/402* (2013.01); *H01L 29/42368* (2013.01); *H01L 29/66659* (2013.01); *H01L 29/66674* (2013.01); *H01L 29/66681* (2013.01); *H01L 29/0653* (2013.01)

(58) Field of Classification Search
CPC .. H01L 29/063; H01L 29/0634; H01L 29/402; H01L 29/66659; H01L 29/66674; H01L 29/66681
USPC ........................................ 257/488, 492, 493
See application file for complete search history.

(56) References Cited

U.S. PATENT DOCUMENTS

| 7,750,401 | B2* | 7/2010 | Cai | ................. H01L 21/823807 257/335 |
| 8,592,274 | B2 | 11/2013 | Tsuchiko | |
| 2009/0072308 | A1* | 3/2009 | Chen | ................. H01L 29/42368 257/336 |
| 2012/0280319 | A1* | 11/2012 | Roehrer | .............. H01L 29/0653 257/337 |
| 2014/0231911 | A1* | 8/2014 | Kim | ................. H01L 29/66681 257/339 |

(Continued)

FOREIGN PATENT DOCUMENTS

| CN | 101211851 A | 7/2008 |
| CN | 101226962 B | 7/2013 |

(Continued)

*Primary Examiner* — Minh-Loan Tran
(74) *Attorney, Agent, or Firm* — Brake Hughes Bellermann LLP (57) ABSTRACT

In a general aspect, a high-voltage metal-oxide-semiconductor (HVMOS) device can include comprising a first gate dielectric layer disposed on a channel region of the HVMOS device and a second gate dielectric layer disposed on at least a portion of a drift region of the HVMOS device. The drift region can be disposed laterally adjacent to the channel region. The second gate dielectric layer can have a thickness that is greater than a thickness of the first gate dielectric layer.

19 Claims, 5 Drawing Sheets

(56) References Cited

U.S. PATENT DOCUMENTS

2014/0264581 A1\* 9/2014 Chan ................ H01L 29/42368
257/339

FOREIGN PATENT DOCUMENTS

| CN | 102104023 B | 9/2013 |
|----|-------------|--------|
| EP | 1291907 A2  | 3/2003 |
| EP | 2270843 A2  | 1/2011 |

\* cited by examiner

REDUCTION OF DEGRADATION DUE TO HOT CARRIER INJECTION

CROSS-REFERENCE TO RELATED APPLICATION

This application claims the benefit of and priority to U.S. Provisional Application No. 62/031,044, filed Jul. 30, 2014, entitled "REDUCTION OF DEGRADATION DUE TO HOT CARRIER INJECTION", the contents of which is hereby incorporated by reference in its entirety.

TECHNICAL FIELD

This description relates to reducing degradation of device performance due to hot carrier injection. In particular, the description relates to reducing degradation of device performance due to hot carrier injection in high-voltage metal-oxide-semiconductor (HVMOS) devices, such as in laterally-diffused (LD) HVMOS devices used in high-voltage applications.

SUMMARY

In a general aspect, a high-voltage metal-oxide-semiconductor (HVMOS) device can include a first gate dielectric layer disposed on a channel region of the HVMOS device and a second gate dielectric layer disposed on at least a portion of a drift region of the HVMOS device, the drift region being disposed laterally adjacent to the channel region. The second gate dielectric layer can have a thickness that is greater than a thickness of the first gate dielectric layer.

Implementations can include one or more of the following features. For instance, the HVMOS device can include a gate electrode disposed on the first gate dielectric layer and the second gate dielectric layer. The HVMOS device can include a source region disposed laterally adjacent to the channel region. The HVMOS device can include a field oxide (FOX) layer, at least a portion of the FOX layer disposed laterally adjacent to the drift region. The HVMOS device can include a drain region, at least a portion of the drain region being disposed laterally adjacent to the FOX layer. At least a portion of the second gate dielectric layer can be disposed on the FOX layer.

The first gate dielectric layer can have a thickness of less than or equal to 115 angstroms. The second gate dielectric layer can have a thickness of less than or equal to 560 angstroms. The channel region can have a lateral width in a range of 0.1 microns ($\mu m$) to 1.0 $\mu m$. The drift region can have a lateral width in a range of 0.2 $\mu m$ to 3.0 $\mu m$. A vertical edge of the second gate dielectric layer can be laterally spaced from the channel region by a distance in a range of 0 $\mu m$ to 1.0 $\mu m$.

In another general aspect, a high-voltage metal-oxide-semiconductor (HVMOS) device can include a first gate dielectric layer disposed on a channel region of the HVMOS device; a second gate dielectric layer disposed on at least a portion of a drift region of the HVMOS device, the drift region being disposed laterally adjacent to the channel region; and a third gate dielectric layer disposed on at least a portion of the second gate dielectric layer. The second gate dielectric layer can have a thickness that is greater than a thickness of the first gate dielectric layer. The third gate dielectric layer can have a thickness that is greater than the thickness of the second gate dielectric layer.

Implementations can include one or more of the following features. For instance, the HVMOS device can include a gate electrode disposed on the first gate dielectric layer, the second gate dielectric layer and the third gate dielectric layer. The HVMOS device can include a source region disposed laterally adjacent to the channel region. The HVMOS device can include a field oxide (FOX) layer, at least a portion of the FOX layer being disposed laterally adjacent to the drift region. The HVMOS device can include a drain region, at least a portion of the drain region being disposed laterally adjacent to the FOX layer. At least a portion of the second gate dielectric layer and at least a portion of the third gate dielectric layer can be disposed on the FOX layer.

The first gate dielectric layer can have a thickness of less than or equal to 115 angstroms. The second gate dielectric layer can have a thickness of less than or equal to 600 angstroms. The third dielectric layer can have a thickness of less than or equal to 2000 angstroms.

The channel region can have a lateral width in a range of 0.1 $\mu m$ to 1.0 $\mu m$. The drift region can have a lateral width in a range of 0.2 $\mu m$ to 3.0 $\mu m$. A vertical edge of the second gate dielectric layer can be laterally spaced from the channel region by a distance in a range of 0 $\mu m$ to 1.0 $\mu m$. A vertical edge of the third gate dielectric layer can be laterally spaced from the vertical edge of the second gate dielectric by a distance in a range of 0 $\mu m$ to 1.0 $\mu m$.

The first gate dielectric layer can be further disposed under at least a portion of the second gate dielectric. A ratio of a combined thickness of the second gate dielectric layer and the third gate dielectric layer to the thickness of the first gate dielectric layer can be approximately 20:1.

In another general aspect, a method can include forming a first gate dielectric layer disposed on at least a portion of a drift region of a high-voltage metal-oxide-semiconductor (HVMOS) device. The drift region can be disposed laterally adjacent to a channel region of the HVMOS device. The method can further include forming a second gate dielectric layer disposed on the channel region. The first gate dielectric layer can have a thickness that is greater than a thickness of the second gate dielectric layer.

Implementations can include one or more of the following features. For instance, the method, prior to forming the second dielectric layer, can include forming a third gate dielectric layer disposed on at least a portion of the first gate dielectric layer. The third gate dielectric layer can have a thickness that is greater than the thickness of the first gate dielectric layer. Forming the second gate dielectric can include forming the second gate dielectric under at least a portion of the first gate dielectric. A thickness of the second gate dielectric under the first gate dielectric can be less than a thickness of the second gate dielectric in the channel region.

DETAILED DESCRIPTION

One concern when designing and producing high-voltage metal-oxide-semiconductor (HVMOS) transistor devices (e.g., laterally-diffused (LD) HVMOS devices) using a semiconductor process, is to obtain an acceptable trade-off between a specific on-resistance ($R_{dson}$) and a breakdown voltage (BV) of a given transistor. Achieving this trade-off is complicated by a further desire to shrink device dimensions and a corresponding die (chip) size without significantly degrading device performance characteristics of the given LD MOS device that can result from aspects of the device design and due to the processing parameters (e.g., dopant levels) selected for a given semiconductor process during development of that process.

For instance, hot carrier (HC) degradation, which is a one reliability limit for certain LD MOS devices, can be affected by device design, as well as by certain semiconductor manufacturing process parameters. For example, $R_{dson}$ can be reduced by increasing a doping concentration in a drift region of an LDMOS device, such as an HVNMOS, or by shrinking a length (lateral length) of a drift region of the device. While reducing $R_{dson}$, such changes can result in higher lateral electric fields in the drift region of a corresponding HVNMOS device and, accordingly, can increase an amount of HC degradation that occurs over a given time in that HVNMOS device. For instance, some LD HVNMOS devices can experience significant HC degradation as shown by a reduction in the linear region drain current ($I_{dlin}$) (e.g., due to increases in $R_{dson}$), such that their reliability lifetime (e.g., an amount of time the device can be placed under worst case operating conditions and still meet its performance specifications) can be on the order of about one hour. In other devices, HC degradation may be shown by device parameters other than $I_{dlin}/R_{dson}$, such as a threshold voltage ($V_{th}$) and/or a drain saturation current ($I_{dsat}$). The specific parameter or parameters used to determine an amount of HC degradation will depend on the specific implementation.

The structures described herein can improve HC degradation in LD HVNMOS devices by reducing a peak (e.g., vertical and/or lateral) electric field (which can be referred to as $E_{max}$) in the drift region of those devices. Based on Maxwell's equation, $E_{max}$ for a given device (LD HVNMOS device) can be determined using Equation 1 below:

$$E_{MAX} \propto t^{-\frac{1}{3}} r_j^{-\frac{1}{3}} \qquad \text{Equation 1}$$

In Equation 1 above, t is gate oxide (or gate dielectric) thickness of the device, while $r_j$ approximately corresponds to drift region junction depth. As may be shown by Equation 1, $E_{max}$ can be reduced by 94% if the gate oxide (dielectric) thickness is increased to 600 angstroms (Å) from 115 Å. While gate structures of the device described herein may be referred to as including one or more gate oxide layers, it will be appreciated that such structures may implemented using any appropriate dielectric material or materials. Therein, the terms oxide and dielectric, for purposes of this disclosure, may be used interchangeably. In certain implementations, other gate dielectric thicknesses are possible.

Figure 3:
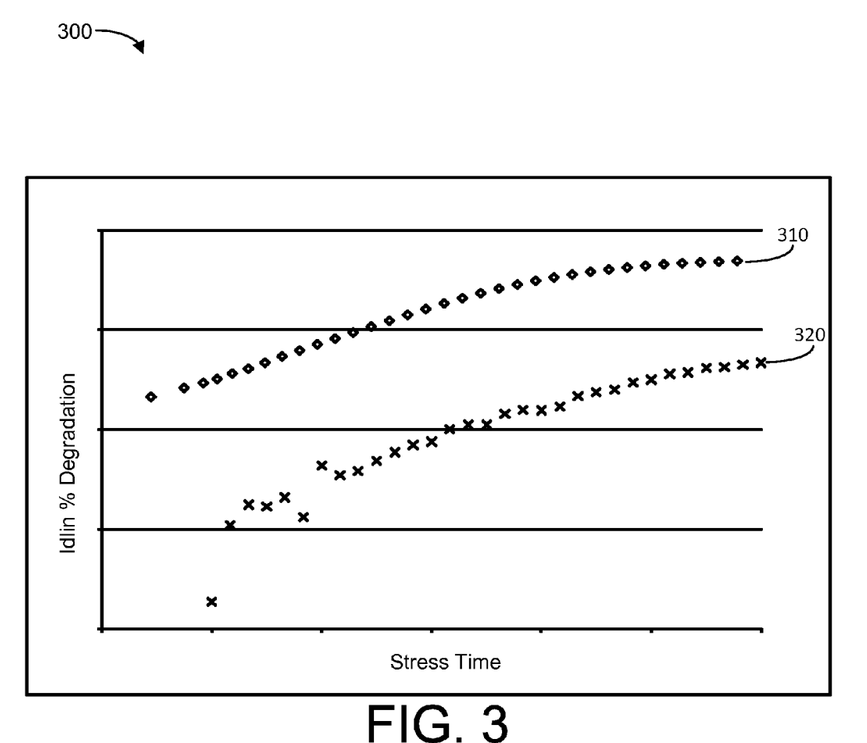
FIG. 3 is a graph illustrating a comparison of device performance degradation due to hot carrier (e.g., electron) injection in an HVNMOS device with thin gate oxide in both the channel region and the drift region and a comparable HVNMOS with a thick gate oxide in both channel region and the drift region according to an implementation.
Figure 4:
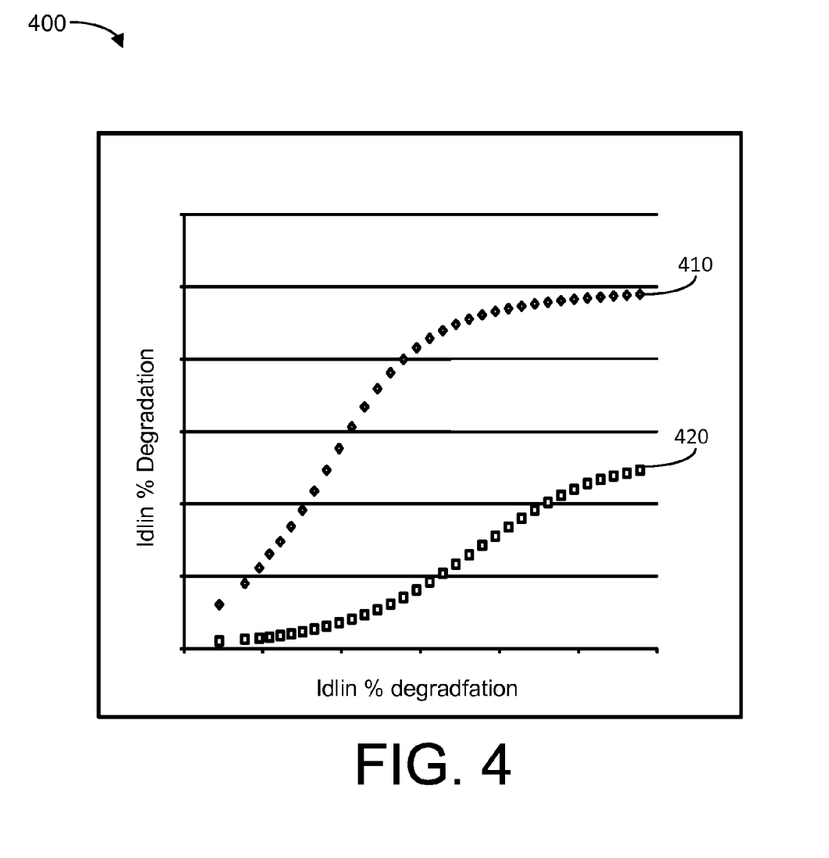
FIG. 4 is a graph illustrating a comparison of degradation due to hot carrier (e.g., electron) injection in an HVNMOS device with thin gate oxide in both the channel region and the drift region and a comparable HVNMOS with a thin gate oxide in the channel region and a thick gate oxide in the drift region, according to an implementation.

With such reductions in $E_{max}$ (as referred to above), HC injection into a gate oxide in the drift region, especially in a field oxide bird's beak region can be significantly reduced. In semiconductor devices (e.g., HVNMOS devices and so forth), impact ionization rates and hot carrier injection probability are typically proportional to $\exp(-1/E_{max})$. Therefore, by decreasing $E_{max}$, hot carrier degradation can be reduced. Experimental data shows that hot carrier degradation (e.g., as measured by $I_{dlin}/R_{dson}$ degradation in a NVNMOS) is significantly reduced using structures such as those described herein. An example of such experimental data is shown in FIGS. 3 and 4 and described in further detail below. Such HC degradation can occur due to interface trapped charge that is caused by (results from) hot carrier injection between silicon (Si) and oxide (gate oxide and/or field oxide) near the field oxide bird's beak and an accumulation region. This interface charge can attract holes and deplete (reduce) an amount of negative charge in the n-drift region, thus increasing $R_{dson}$ and, as a result, reducing $I_{dlin}$. In certain devices, this depletion of negative charge has an adverse impact on $R_{dson}/I_{dlin}$ because the $I_{dlin}$ current path is along the interface between Si and a gate oxide disposed on the drift region of the device.

In structures such as those described herein, because $E_{max}$ is reduced (which causes a corresponding reduction in hot carrier injection), a doping concentration in the drift region can be increased (e.g., to compensate for the lower (e.g., vertical and/or lateral) electric field in the drift region) in order to obtain a lower $R_{dson}$ with substantially the same BV in a thin oxide (thin dielectric) in the drift region in LDMOS devices.

Figure 1:
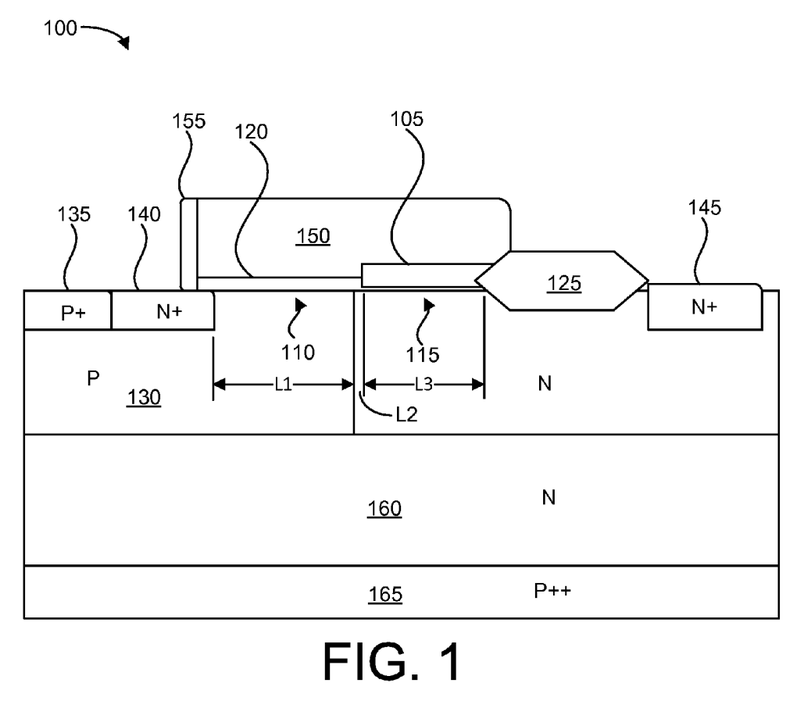
FIG. 1 is a cross-sectional diagram illustrating an LD high-voltage N-type MOSFET (HVNMOS) device, according to an implementation.

FIG. 1 is a cross-sectional diagram illustrating a laterally-diffused (LD), high-voltage N-type MOSFET (HVNMOS) device 100, according to an implementation. The HVNMOS device shown in FIG. 1 may be formed using the following processing operations. It will be appreciated that other processing operations can be performed when producing the device shown in FIG. 1. However, for purposes of clarity and illustration, those processing operations are not described here.

For the HVNMOS device 100 implementation shown in FIG. 1, a thick gate oxide layer (thick gate dielectric layer) 105 can be grown on a channel region 110 (e.g., an n-type enhancement region) and a drift (n-type) region 115 of the device 100. In an implementation, the thick gate oxide layer 105 can be approximately 560 Å. In other embodiments, the thick gate oxide layer 105 may be thicker or thinner than 560 Å. The thick gate oxide layer 105 can then be masked and removed (e.g., using one or more photolithography and/or etch processes) in the channel region 110 of the device 100 of FIG. 1. In certain embodiments, a ratio of the thickness of the thick gate oxide layer 105 to a thickness of the thin gate oxide layer can be in a range of 5-1. In other implementations, other ratios are possible.

After removing the thick gate oxide (dielectric) layer 105 in the channel region 110, a thin gate oxide layer 120 (which can also be, or can be referred to as a channel gate oxide layer, a thin gate dielectric layer, a channel gate dielectric layer, and so forth) can be formed in the channel region 110. In an implementation, the thin gate oxide layer 120 can have a thickness of approximately 115 Å. In other implementations, the thin gate oxide layer 120 can have other thicknesses (e.g., thinner or thicker than 115 Å) and can be present under the thick gate oxide layer 105 in the drift region 115 (e.g., can be thinner in the drift region 115 than in the channel region 110, such as illustrated in FIG. 1). In still other implementations, the thin gate oxide layer 120 may not be present under the thick gate oxide layer 105. The remaining features of the device 100 illustrated in FIG. 1 can be formed using a number of appropriate semiconductor processing operations, which could be performed prior to and/or subsequent to the processing operations discussed above.

For example, the device 100 can include a p-type body region 130 and a p-type heavy body region 135, where a doping concentration in the heavy body region 135 is great than a doping concentration in the p-type body region 130. The device 100 can also include a source (n-type) region 140 and a drain (n-type) region 145. The device 100 can further include a gate electrode 150, a spacer (e.g., dielectric spacer) 155, an n-type region 160 (e.g., an n-type epitaxial layer) and a heavily doped p-type substrate 165. In other implementations, the conductivity types of the various regions of the device 100 can be reversed (e.g., from p-type to n-type, and vice versa) to produce a P-channel LD HVMOS (LD HVPMOS) device.

In an embodiment, the channel region 110 of the device 100 can have a lateral length of L1, where L1 can be in a range of 0.1 to 1 microns (μm). The drift region 115 can have lateral length of L2+L3, where L2 is a lateral distance from a boundary of the p-type body region 130 and the drift region 115 to a vertical edge of the thick gate oxide layer 105 and L3 is a distance from the vertical edge of the thick gate oxide layer 105 to a FOX region (layer) 125 (e.g., a bird's beak region) of the device 100. In implementations, L2 can be in a range of 0 to 1 μm and L3 can be in a range of 0.2 to 2 μm. In other implementations, an LD HVNMOS or LD HVPMOS device can have other dimension lengths. The thick gate oxide layer 105 of the device 100 of FIG. 1 can reduce a peak (e.g., vertical and/or lateral) electric field ($E_{max}$) in the drift 115 region of the device 100. Accordingly, hot carrier injection is reduced in the device 100 shown in FIG. 1, as compared to a substantially identical device that does not include the thick gate oxide layer 105 (i.e., only includes the thin gate oxide layer 120). Furthermore, such a structure reduces the electric field strength in the "bird's beak" region of the field oxide (FOX) region 125 of the device shown in FIG. 1, which can result in an increase in breakdown voltage (BV) of the LD HVNMOS device 100 of FIG. 1, as compared to a substantially identical device that does not include the thick gate oxide layer 105 (i.e., only includes the thin gate oxide layer 120). Further, because $E_{max}$ is reduced, a doping concentration the drift region 115 can be increased in order to obtain a lower Rdson without significantly affecting HC degradation performance or BV performance.

Figure 2:
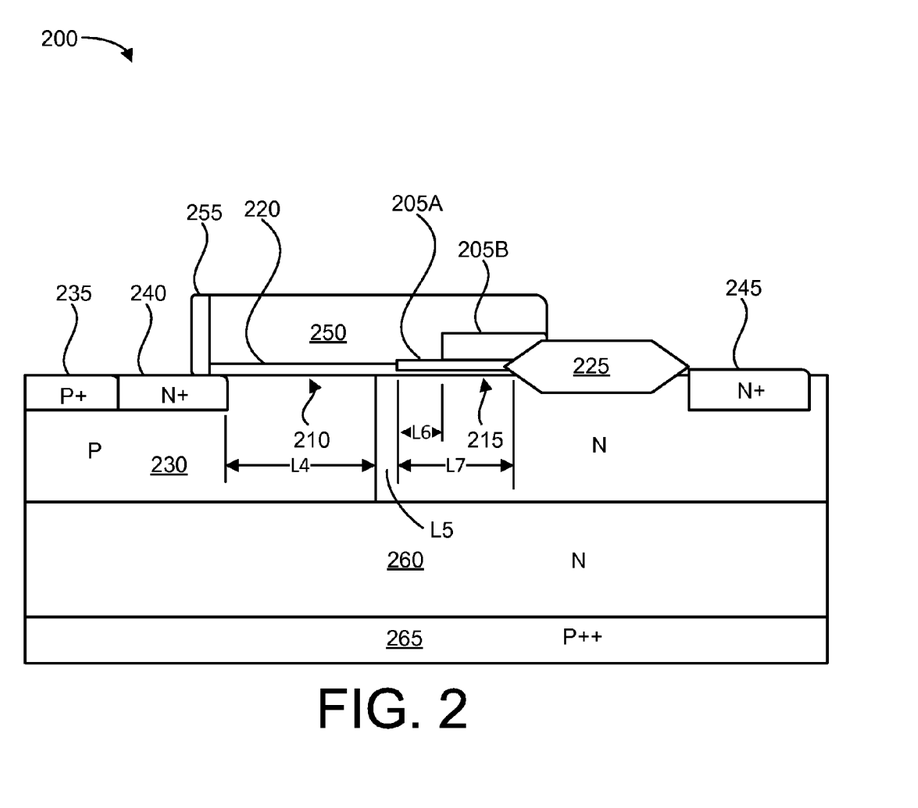
FIG. 2 is a cross-sectional diagram illustrating another LD HVNMOS device, according to an implementation.

FIG. 2 is a cross-sectional diagram illustrating another high-voltage N-type MOSFET (HVNMOS) device 200, according to an implementation. In the structure of FIG. 2, a first thick gate oxide layer 205A and a second thick gate oxide layer 205B are formed on a drift region 215 of the HVNMOS device 200, which can reduce $E_{max}$ in the drift region 215. A thickness of the first thick gate oxide layer 205A in FIG. 2 can be in a range of 400 Å to 600 Å. In certain implementations, the first thick gate oxide layer 205A can have a thickness that is less than 400 Å or greater than 600 Å. The second thick gate oxide layer 205B can be a PECVD oxide or can include a number of other insulator (or dielectric) materials. The second thick gate oxide 205B can have a thickness that is in a range of 1000 Å to 2000 Å.

In certain implementations, the second thick gate oxide layer 205B can have a thickness that is less than 1000 Å or greater than 2000 Å. In certain embodiments, a ratio of the thickness of the first thick gate oxide layer 205A to a thickness of the second thick gate oxide layer 205B can be approximately 1:4. A ratio of the overall thickness of the first thick gate oxide layer 205A and the second thick gate oxide layer 205B to the thin gate oxide layer 220 can be approximately 20:1. In other implementations, other ratios are possible.

The HVNMOS device 200 shown in FIG. 2 may be formed using the following processing operations. As with the device 100 of FIG. 1, it will be appreciated that other processing operations can be performed when producing the device 200 shown in FIG. 2. However, for purposes of clarity and illustration, those processing operations are not described here.

For the HVNMOS device 200 shown in FIG. 2, the first thick gate oxide layer 205A can be grown on a channel region 210 (e.g., an n-type enhancement channel) and the drift region 215 of the device 200. After growing (depositing, etc.) the first thick gate oxide layer 205A, the second thick gate oxide layer 205B can be formed (e.g., grown or deposited) on the first thick gate oxide layer 205A. The second thick gate oxide layer 205B can then be masked and removed (e.g., using one or more photolithography and/or etch processes), such as shown in FIG. 2. The first thick gate oxide 205A layer can then be masked and removed (e.g., using one or more photolithography and/or etch processes) in the channel region 210 of the device 200 of FIG. 2, such as illustrated by the device 200.

After removing the first thick gate oxide layer 205A in the channel region 210 of the device 200 of FIG. 2, a thin gate oxide (or dielectric) layer 220 (which can also be referred to as a channel gate oxide layer, a thin gate dielectric layer, a channel gate dielectric layer, etc.) can be formed in the channel region 210 of the device 200. In an implementation, the thin gate oxide layer 220 can have a thickness of approximately 115 Å. In other implementations, the thin oxide layer 220 can have other thicknesses (e.g., thinner or thicker) and can be present under the first thick gate oxide layer 205A in the drift region 115 (e.g., can be thinner in the drift region 215 than in the channel region 210, as illustrated in FIG. 2). In still other implementations, the thin gate oxide layer 220 may not be present under the first thick gate oxide layer 205A. The remaining features of the device 200 illustrated in FIG. 2 can be formed using a number of appropriate semiconductor processing operations, which could be performed prior to and/or subsequent to the processing operations discussed above.

For instance, as with the device 100, the device 200 can include a p-type body region 230 and a p-type heavy body region 235, where a doping concentration in the p-type heavy body region 235 is great than a doping concentration in the p-type body region 230. The device 200 can also include a source (n-type) region 240 and a drain (n-type) region 245. The device 200 can further include a gate electrode 250, a spacer (e.g., dielectric spacer) 255, an n-type region 260 (e.g., an n-type epitaxial layer) and a heavily doped p-type substrate 265. In other implementations, the conductivity types of the various regions of the device 200 can be reversed (e.g., from p-type to n-type, and vice versa) to produce a P-channel LD HVMOS device.

In an embodiment, the channel region 210 of the device 200 can have a lateral length of L4, where L4 can be in a range of 0.1-1.0 μm. The drift region 215 can have lateral length of L5+L7, where L5 is a lateral distance from a boundary of the p-type body region 230 and the drift region 215 to a vertical edge of the first thick gate oxide layer 205A and L7 is a distance from the vertical edge of the first thick gate oxide layer 205A to a FOX region (layer) 225 (e.g., a bird's beak region of the FOX layer 225) of the device 200. In the device 200, a distance L6 is a lateral distance between the vertical edge of the first thick gate oxide layer 205A and a vertical edge of the second thick gate oxide layer 205B. In implementations, L5 can be in a range of 0-1.0 µm, L6 can be in a range of 0-1.0 µm and L7 can be in a range of 0.2-2 µm. In other implementations, an LD HVNMOS can have other dimensions (lengths).

The first thick gate oxide layer 205A and the second thick gate oxide layer 205B in the drift region 215 of the device 200 of FIG. 2 can reduce a peak (e.g., vertical and/or lateral) electric field ($E_{max}$) in the drift region 215 of the device 200, as compared to a substantially similar device that does not include the first thick gate oxide layer 205A and/or the second thick gate oxide layer 205B (i.e., only includes the thin gate oxide layer 220). Accordingly, hot carrier injection can be reduced in the device 200 shown in FIG. 2 as compared to a substantially identical device that does not include the first thick gate oxide layer 205A and the second thick gate oxide layer 205B (i.e., only includes the thin gate oxide layer 220). Furthermore, as with the device 100 of FIG. 1, such a structure reduces the electric field density in the "bird's beak" region of the FOX region (layer) 225 of the device 200 shown in FIG. 2, which can result in an increase in breakdown voltage (BV) of the LD HVNMOS device 200 of FIG. 2, as compared to a substantially identical device that does not include the first thick gate oxide layer 205A and the second thick gate oxide layer 205B (i.e., only includes the thin gate oxide layer 220). Further, because $E_{max}$ is reduced, a doping concentration in the drift region 215 can be increased in order to obtain a lower Rdson without significantly affecting HC degradation performance or BV performance.

FIG. 3 is a graph 300 illustrating a comparison of performance degradation (as measured by $I_{dlin}$) due to hot carrier (e.g., electron) injection in an HVNMOS device with only thin gate oxide in both the channel region and the drift region (trace 310) and a comparable HVNMOS device with a thick gate oxide in the channel region and the drift region (trace 320) (as compared to the devices shown in FIGS. 1 and 2 where the thick gate oxide layer(s) is(are) present only in the drift region), according to an implementation. As shown by the graph 300 in FIG. 3, the thick gate oxide LD HVNMOS (trace 320) has a much better (e.g., approximately 10× better) HC degradation performance than a comparable device with only a thin gate oxide layer (trace 310), as evidenced by the lower $I_{dlin}$ degradation percentages.

FIG. 4 is a graph 400 illustrating a comparison of performance degradation (as measured by $I_{dlin}$) due to hot carrier (e.g., electron) injection in an HVNMOS device with a thin gate oxide in both the channel region and the drift region (trace 410) and a comparable HVNMOS with a thin gate oxide in the channel region and a thick gate oxide layer in the drift region (trace 420) (such as in the devices shown in FIGS. 1 and 2), according to an implementation.

In the comparison shown in FIG. 4 (as well as in the comparison shown in FIG. 3), a HC stress voltage applied to the devices is higher for the LD HVNMOS devices with the thick gate oxide layer(s) (or structure) in the drift region and over the bird's beak region, than the HC stress voltage applied to the comparable devices without the thick gate oxide (layer or structure) in the drift region. As shown, even under these more extreme conditions, the $I_{dlin}$ degradation is much lower (as shown by the traces 320 and 420 as compared to the traces 310 and 410, respectively) for the HVNMOS devices with the thick gate oxide (layer(s) or structure) in the drift region, than for the comparable devices without the thick gate oxide (layer or structure) in the drift region.

Figure 5:
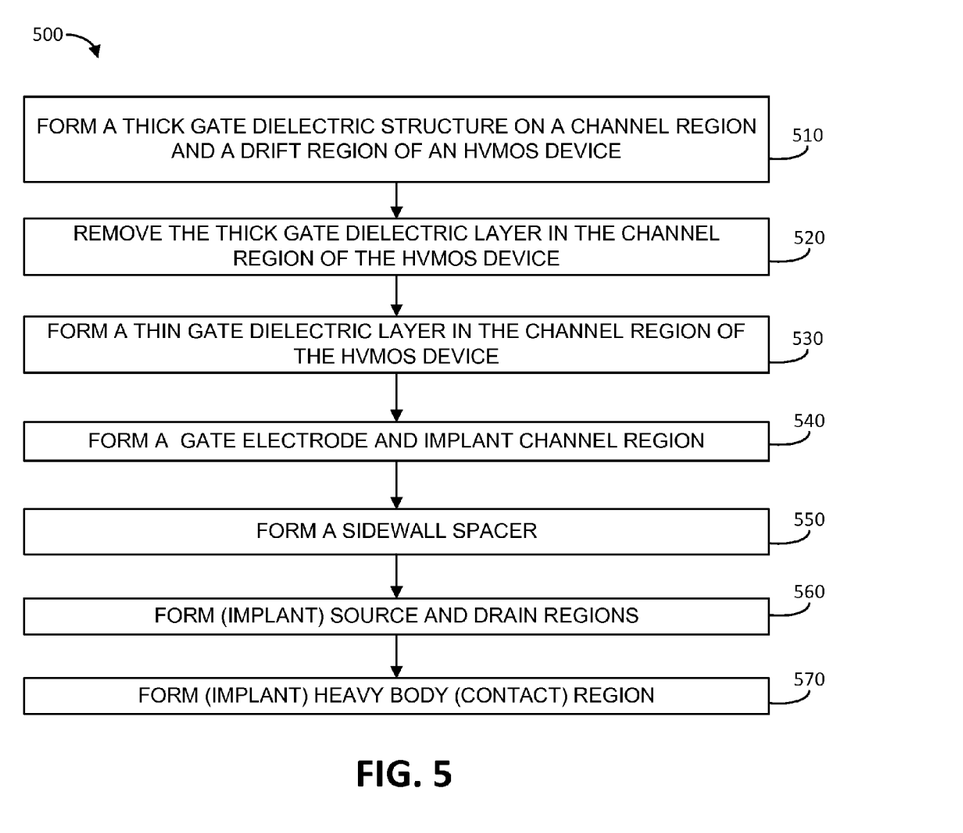
FIG. 5 is a flowchart illustrating a method for forming an HVMOS device, according to an implementation.

FIG. 5 is a flowchart illustrating a method 500 for forming an HVMOS device, according to an implementation. The method 500 is shown by way of example, and other process flows for producing HVMOS devices, such as the devices shown in FIGS. 1 and 2 are possible. In certain implementations, one or more of the operations (e.g., semiconductor processing operations) shown in FIG. 5 can be omitted from the method 500 and/or one or more operations can added to the method 500. Further, in some implementations, the operations of the method 500 can be performed in an order (or orders) other than illustrated in FIG. 5. In example implementations, the method 500 can be used to produce the devices 100 and 200 illustrated in FIGS. 1 and 2, respectively.

At block 510, the method 500 includes forming a thick gate dielectric structure on a channel region and a drift region of an HVMOS device. In an implementation, the thick gate dielectric structure of block 510 can be formed as was described with respect to the device 100 of FIG. 1. In another implementation, the thick gate dielectric structure of block 510 can be formed as described with respect to the device 200 of FIG. 2. In other implementations, a thick gate dielectric structure can be formed in a number of other ways.

At block 520, the method 500 includes removing the thick gate dielectric structure of block 510 from the channel region of the HVMOS device. For instance, the thick gate dielectric structure can be removed from the channel region as was described with respect to FIG. 1 (e.g., using photolithography operations on the thick gate dielectric 105). In other implementations, the thick gate dielectric structure can be removed from the channel region of the HVMOS device as was described with respect to FIG. 2 (e.g., using first photolithography operations on the first thick gate dielectric 205A and second photolithography operations on the second thick gate dielectric 205B). In still other implementations, the thick gate dielectric structure of block 510 can be removed from the channel region of the HVMOS device using other approaches.

At block 530, the method 500 includes forming a thin gate dielectric in the channel region (and, in some implementations, the drift region) of the HVMOS device. At block 540, the method 500 includes forming a gate electrode and implanting the channel region of the HVMOS device. In an implementation, forming an LD HVMOS device can include, at block 540, implanting the channel region after the gate electrode is formed, while in other implementations, forming an HVMOS device can include, at block 540, implanting the channel region prior to forming the gate electrode.

At block 550, the method 500 includes forming a sidewall spacer (e.g., adjacent the gate electrode and the thin gate dielectric), which can facilitate formation of a self-aligned source region in an HVMOS device. In HVMOS devices where the source region is not self-aligned, the operation of block 550 can be omitted. At block 560, the method 500 can include forming (implanting) source and drain regions of the HVMOS device. At block 570, the method 500 can include forming (implanting) a heavy body (contact, ohmic contact, etc.) region of the HVMOS device.

In implementations, the method 500 can also include (e.g., prior to block 510, or in any appropriate order in conjunction with the operations of the method 500) forming a FOX layer (such as the FOX layers 125 and 225); forming an epitaxial layer (such as the epitaxial layers 160 and 260); forming a body region (such as the body regions 130 and 230); and forming a drift region (such as the drift regions 115 and 215) of the HVMOS device. The specific order of the operations of the method 500 (or other method for producing an HVMOS device) will depend on the specific implementation (e.g., the specific device being formed and/or the specific semiconductor manufacturing processes used).

In an implementation, a high-voltage metal-oxide-semiconductor (HVMOS) device can include a first gate dielectric layer disposed on a channel region of the HVMOS device and a second gate dielectric layer disposed on at least a portion of a drift region of the HVMOS device, the drift region being disposed laterally adjacent to the channel region. The second gate dielectric layer can have a thickness that is greater than a thickness of the first gate dielectric layer.

Implementations can include one or more of the following features. For instance, the HVMOS device can include a gate electrode disposed on the first gate dielectric layer and the second gate dielectric layer. The HVMOS device can include a source region disposed laterally adjacent to the channel region. The HVMOS device can include a field oxide (FOX) layer, at least a portion of the FOX layer disposed laterally adjacent to the drift region. The HVMOS device can include a drain region, at least a portion of the drain region being disposed laterally adjacent to the FOX layer. At least a portion of the second gate dielectric layer can be disposed on the FOX layer.

The first gate dielectric layer can have a thickness of less than or equal to 115 angstroms. The second gate dielectric layer can have a thickness of less than or equal to 560 angstroms. The channel region can have a lateral width in a range of 0.1 microns ($\mu$m) to 1.0 $\mu$m. The drift region can have a lateral width in a range of 0.2 $\mu$m to 3.0 $\mu$m. A vertical edge of the second gate dielectric layer can be laterally spaced from the channel region by a distance in a range of 0 $\mu$m to 1.0 $\mu$m.

In another implementation, a high-voltage metal-oxide-semiconductor (HVMOS) device can include a first gate dielectric layer disposed on a channel region of the HVMOS device; a second gate dielectric layer disposed on at least a portion of a drift region of the HVMOS device, the drift region being disposed laterally adjacent to the channel region; and a third gate dielectric layer disposed on at least a portion of the second gate dielectric layer. The second gate dielectric layer can have a thickness that is greater than a thickness of the first gate dielectric layer. The third gate dielectric layer can have a thickness that is greater than the thickness of the second gate dielectric layer.

Implementations can include one or more of the following features. For instance, the HVMOS device can include a gate electrode disposed on the first gate dielectric layer, the second gate dielectric layer and the third gate dielectric layer. The HVMOS device can include a source region disposed laterally adjacent to the channel region. The HVMOS device can include a field oxide (FOX) layer, at least a portion of the FOX layer being disposed laterally adjacent to the drift region. The HVMOS device can include a drain region, at least a portion of the drain region being disposed laterally adjacent to the FOX layer. At least a portion of the second gate dielectric layer and at least a portion of the third gate dielectric layer can be disposed on the FOX layer.

The first gate dielectric layer can have a thickness of less than or equal to 115 angstroms. The second gate dielectric layer can have a thickness of less than or equal to 600 angstroms. The third dielectric layer can have a thickness of less than or equal to 2000 angstroms.

The channel region can have a lateral width in a range of 0.1 $\mu$m to 1.0 $\mu$m. The drift region can have a lateral width in a range of 0.2 $\mu$m to 3.0 $\mu$m. A vertical edge of the second gate dielectric layer can be laterally spaced from the channel region by a distance in a range of 0 $\mu$m to 1.0 $\mu$m. A vertical edge of the third gate dielectric layer can be laterally spaced from the vertical edge of the second gate dielectric by a distance in a range of 0 $\mu$m to 1.0 $\mu$m.

The first gate dielectric layer can be further disposed under at least a portion of the second gate dielectric. A ratio of a combined thickness of the second gate dielectric layer and the third gate dielectric layer to the thickness of the first gate dielectric layer can be approximately 20:1.

In another implementation, a method can include forming a first gate dielectric layer disposed on at least a portion of a drift region of a high-voltage metal-oxide-semiconductor (HVMOS) device. The drift region can be disposed laterally adjacent to a channel region of the HVMOS device. The method can further include forming a second gate dielectric layer disposed on the channel region. The first gate dielectric layer can have a thickness that is greater than a thickness of the second gate dielectric layer.

Implementations can include one or more of the following features. For instance, the method, prior to forming the second dielectric layer, can include forming a third gate dielectric layer disposed on at least a portion of the first gate dielectric layer. The third gate dielectric layer can have a thickness that is greater than the thickness of the first gate dielectric layer. Forming the second gate dielectric can include forming the second gate dielectric under at least a portion of the first gate dielectric. A thickness of the second gate dielectric under the first gate dielectric can be less than a thickness of the second gate dielectric in the channel region.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A high-voltage metal-oxide-semiconductor (HVMOS) device comprising:
   a first gate dielectric layer disposed on a channel region of the HVMOS device; and a second gate dielectric layer disposed on at least a portion of a drift region of the HVMOS device, the drift region being disposed laterally adjacent to the channel region, the first gate dielectric having a portion disposed under at least a portion of the second gate dielectric, the second gate dielectric layer having a thickness that is greater than a thickness of the first gate dielectric layer.

2. The HVMOS device of claim 1, further comprising:
a gate electrode disposed on the first gate dielectric layer and the second gate dielectric layer.

3. The HVMOS device of claim 1, further comprising:
a source region disposed laterally adjacent to the channel region;
a field oxide (FOX) layer, at least a portion of the FOX layer disposed laterally adjacent to the drift region; and
a drain region, at least a portion of the drain region being disposed laterally adjacent to the FOX layer.

4. The HVMOS device of claim 3, wherein at least a portion of the second gate dielectric layer is disposed on the FOX layer.

5. The HVMOS device of claim 1, wherein:
the first gate dielectric layer has a thickness of less than or equal to 115 angstroms; and
the second gate dielectric layer has a thickness of less than or equal to 560 angstroms.

6. The HVMOS device of claim 1, wherein:
the channel region has a lateral width in a range of 0.1 microns (μm) to 1.0 μm; and
the drift region has a lateral width in a range of 0.2 μm to 3.0 μm.

7. The HVMOS device of claim 1, wherein a vertical edge of the second gate dielectric layer is laterally spaced from the channel region by a distance in a range of 0 microns (μm) to 1.0 μm.

8. A high-voltage metal-oxide-semiconductor (HVMOS) device comprising:
a first gate dielectric layer disposed on a channel region of the HVMOS device;
a second gate dielectric layer disposed on at least a portion of a drift region of the HVMOS device, the drift region being disposed laterally adjacent to the channel region; and
a third gate dielectric layer disposed on at least a portion of the second gate dielectric layer,
the second gate dielectric layer having a thickness that is greater than a thickness of the first gate dielectric layer,
the third gate dielectric layer having a thickness that is greater than the thickness of the second gate dielectric layer.

9. The HVMOS device of claim 8, further comprising:
a gate electrode disposed on the first gate dielectric layer, the second gate dielectric layer and the third gate dielectric layer.

10. The HVMOS device of claim 8, further comprising:
a source region disposed laterally adjacent to the channel region;
a field oxide (FOX) layer, at least a portion of the FOX layer being disposed laterally adjacent to the drift region; and
a drain region, at least a portion of the drain region being disposed laterally adjacent to the FOX layer.

11. The HVMOS device of claim 10, wherein at least a portion of the second gate dielectric layer and at least a portion of the third gate dielectric layer are disposed on the FOX layer.

12. The HVMOS device of claim 8, wherein:
the first gate dielectric layer has a thickness of less than or equal to 115 angstroms;
the second gate dielectric layer has a thickness of less than or equal to 600 angstroms; and
the third dielectric layer has a thickness of less than or equal to 2000 angstroms.

13. The HVMOS device of claim 8, wherein:
the channel region has a lateral width in a range of 0.1 microns (μm) to 1.0 μm; and
the drift region has a lateral width in a range of 0.2 μm to 3.0 μm.

14. The HVMOS device of claim 8, wherein:
a vertical edge of the second gate dielectric layer is laterally spaced from the channel region by a distance in a range of 0 microns (μm) to 1.0 μm; and
a vertical edge of the third gate dielectric layer is laterally spaced from the vertical edge of the second gate dielectric by a distance in a range of 0 μm to 1.0 μm.

15. The HVMOS device of claim 8, wherein the first gate dielectric layer is further disposed under at least a portion of the second gate dielectric.

16. The HVMOS device of claim 8, wherein a ratio of a combined thickness of the second gate dielectric layer and the third gate dielectric layer to the thickness of the first gate dielectric layer is approximately 20:1.

17. A method comprising:
forming a first gate dielectric layer disposed on at least a portion of a drift region of a high-voltage metal-oxide-semiconductor (HVMOS) device, the drift region being disposed laterally adjacent to a channel region of the HVMOS device; and
forming a second gate dielectric layer disposed on the channel region, the forming the second gate dielectric including forming the second gate dielectric under at least a portion of the first gate dielectric,
the first gate dielectric layer having a thickness that is greater than a thickness of the second gate dielectric layer.

18. The method of claim 17, wherein the method, prior to forming the second dielectric layer, further comprises:
forming a third gate dielectric layer disposed on at least a portion of the first gate dielectric layer,
the third gate dielectric layer having a thickness that is greater than the thickness of the first gate dielectric layer.

19. The method of claim 17, wherein a thickness of the second gate dielectric under the first gate dielectric is less than a thickness of the second gate dielectric in the channel region.

* * * * *